United States Patent
Zuniga-Ortiz et al.

(10) Patent No.: US 8,338,208 B2
(45) Date of Patent: Dec. 25, 2012

(54) MICRO-ELECTRO-MECHANICAL SYSTEM HAVING MOVABLE ELEMENT INTEGRATED INTO LEADFRAME-BASED PACKAGE

(75) Inventors: Edgar Rolando Zuniga-Ortiz, McKinney, TX (US); William R. Krenik, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/969,910

(22) Filed: Dec. 16, 2010

(65) Prior Publication Data

US 2011/0156178 A1 Jun. 30, 2011

Related U.S. Application Data

(60) Provisional application No. 61/291,773, filed on Dec. 31, 2009.

(51) Int. Cl.
*H01L 21/00* (2006.01)
(52) U.S. Cl. .............. 438/51; 257/415; 257/E21.001; 257/E29.324
(58) Field of Classification Search .......... 257/415, 257/E21.001, E29.324; 438/51
See application file for complete search history.

(56) References Cited

U.S. PATENT DOCUMENTS

| | | | |
|---|---|---|---|
| 5,856,914 | A | 1/1999 | O'Boyle |
| 2005/0067695 | A1 | 3/2005 | Brandl et al. |
| 2005/0186703 | A1 * | 8/2005 | Weiblen et al. ............ 438/106 |
| 2006/0008098 | A1 | 1/2006 | Tu |
| 2007/0275494 | A1 | 11/2007 | Mayer et al. |
| 2010/0207217 | A1 | 8/2010 | Zuniga-Ortiz |

* cited by examiner

*Primary Examiner* — Kimberly Rizkallah
*Assistant Examiner* — Marvin Payen
(74) *Attorney, Agent, or Firm* — Warren L. Franz; Wade J. Brady, III; Frederick J. Telecky, Jr.

(57) ABSTRACT

A MEMS may integrate movable MEMS parts, such as mechanical elements, flexible membranes, and sensors, with the low-cost device package, leaving the electronics and signal-processing parts in the integrated circuitry of the semiconductor chip. The package may be a leadframe-based plastic molded body having an opening through the thickness of the body. The movable part may be anchored in the body and extend at least partially across the opening. The chip may be flip-assembled to the leads to span across the foil, and may be separated from the foil by a gap. The leadframe may be a prefabricated piece part, or may be fabricated in a process flow with metal deposition on a sacrificial carrier and patterning of the metal layer. The resulting leadframe may be flat or may have an offset structure useful for stacked package-on-package devices.

12 Claims, 9 Drawing Sheets

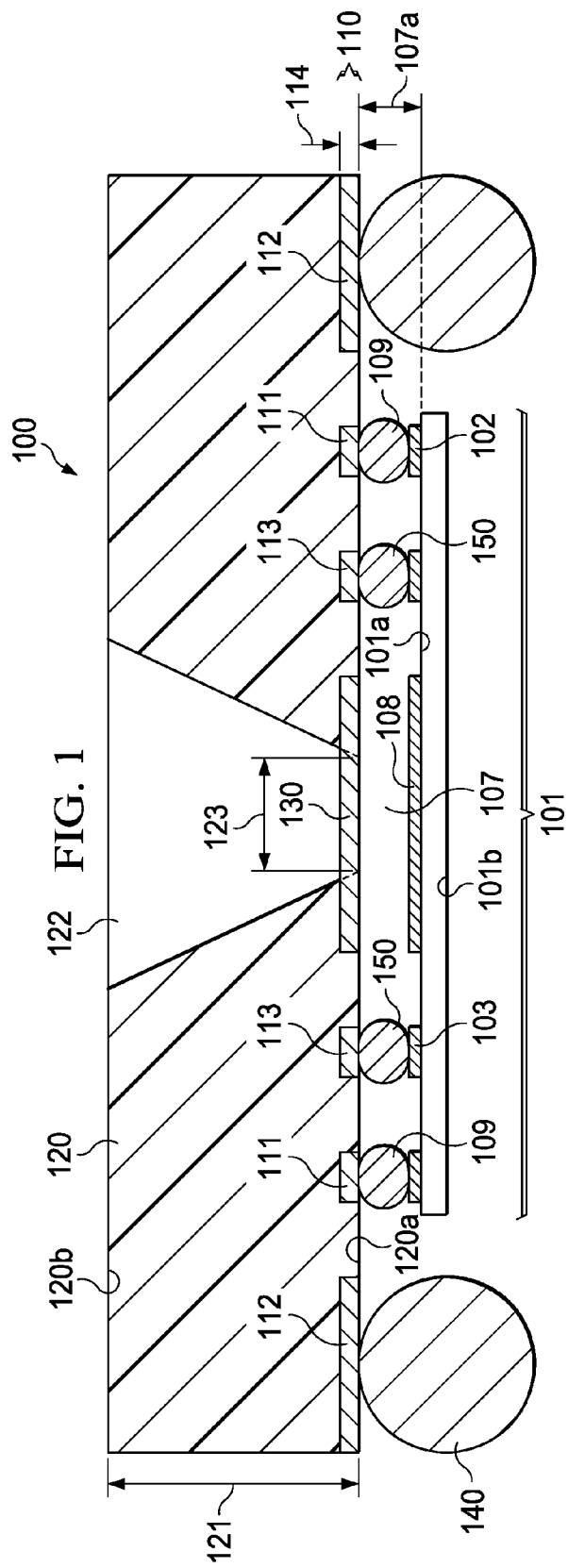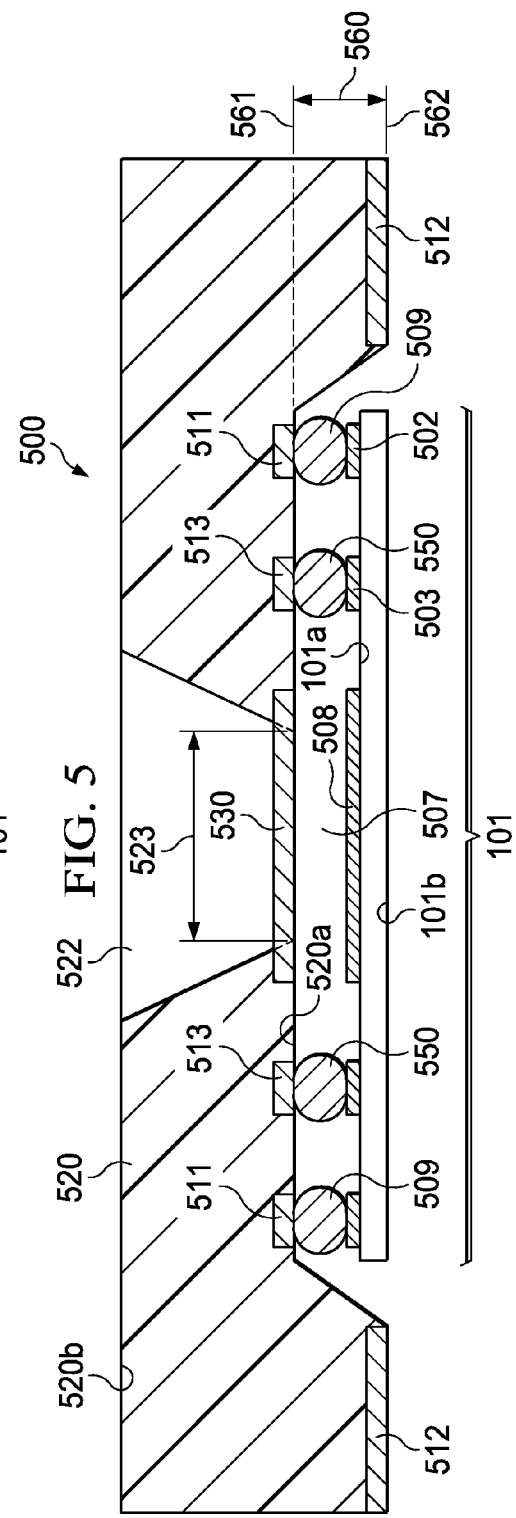

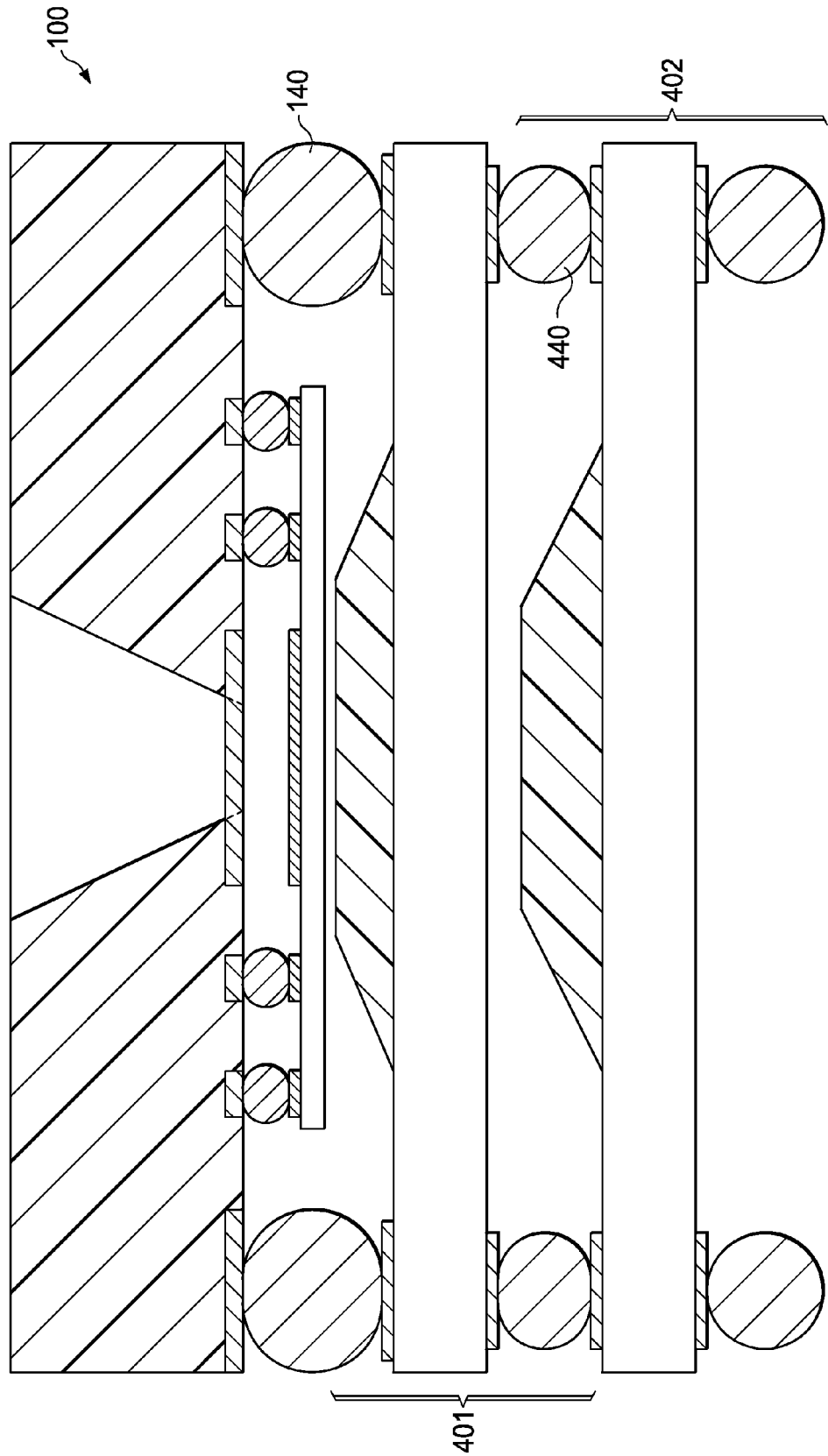

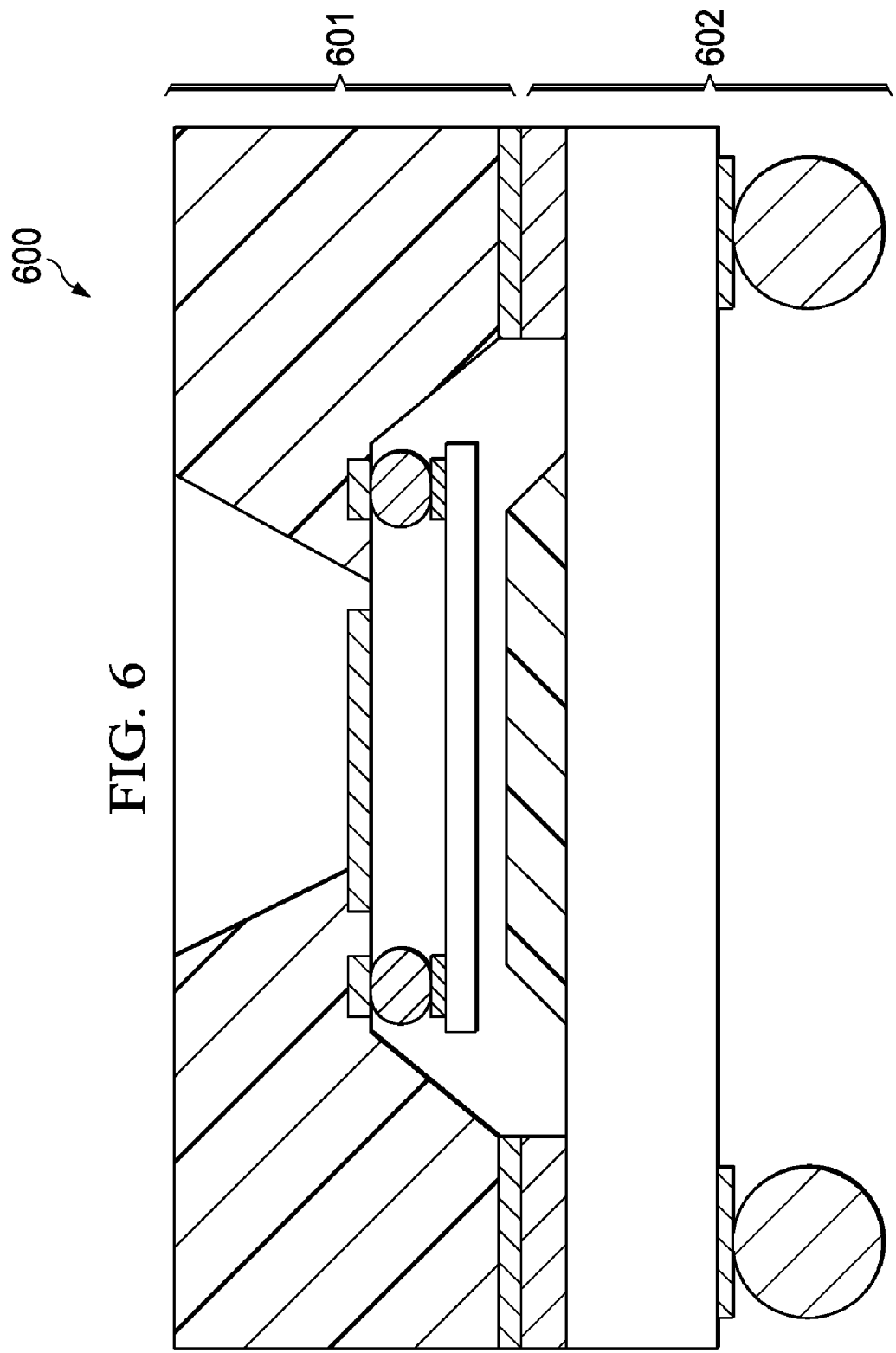

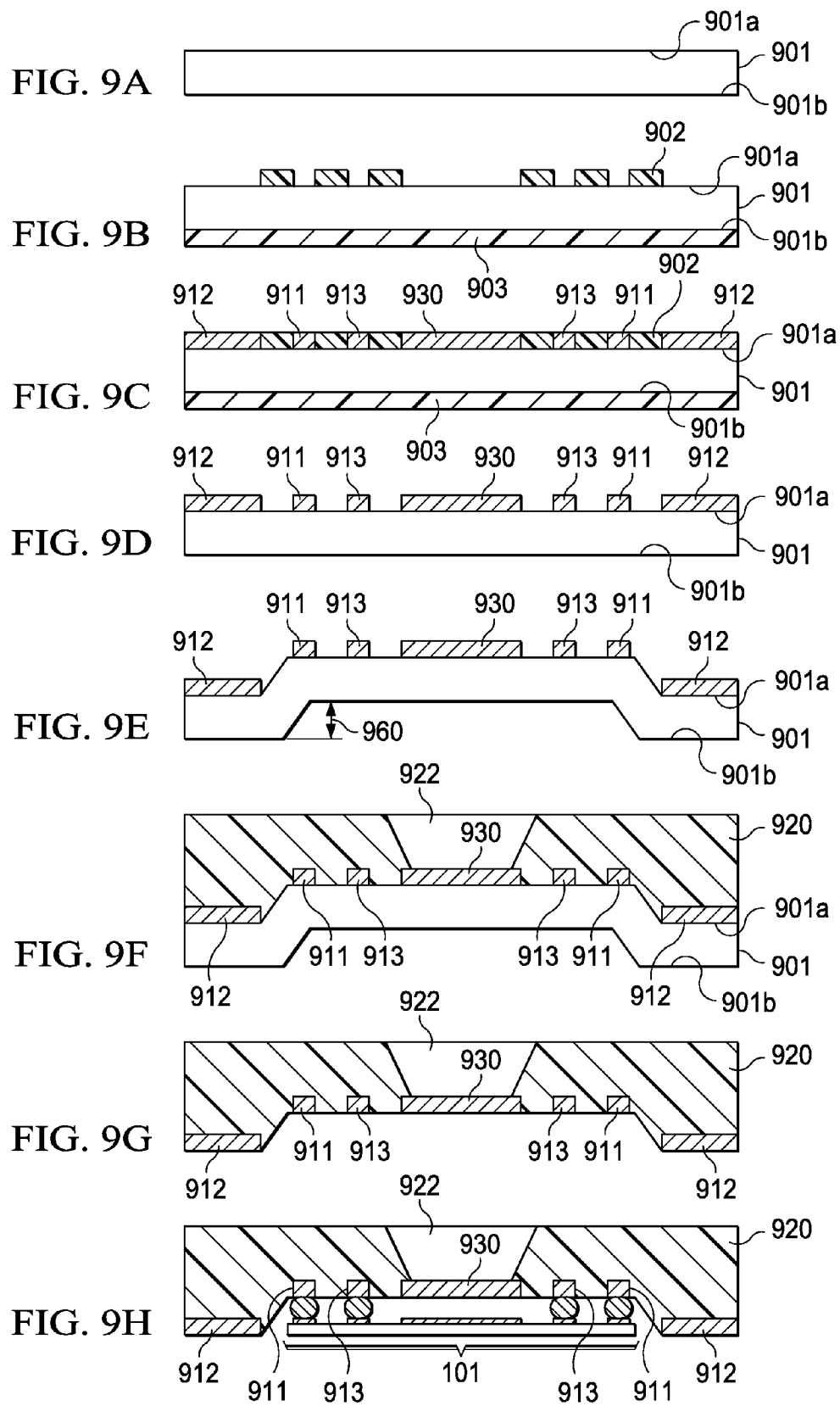

ial output signal. The change in pressure causes a displacement, the displacement causes a capacitor change, and the capacitor change causes an electrical signal—similar to the operation of a condenser microphone. Nonlinearity and parasitic capacitances and residual membrane stress represent challenges for MEMS membrane fabrication of silicon and epitaxial silicon.

MICRO-ELECTRO-MECHANICAL SYSTEM HAVING MOVABLE ELEMENT INTEGRATED INTO LEADFRAME-BASED PACKAGE

FIELD OF THE INVENTION

The present invention is related in general to the field of semiconductor devices and processes, and more specifically to the structure and fabrication method of Micro-Electro-Mechanical systems (MEMS) having the movable element integrated into a leadframe-based molded package and the sensing element built on the integrated circuit.

DESCRIPTION OF RELATED ART

The wide variety of products collectively called Micro-Electro-Mechanical systems (MEMS) are small, low weight devices on the micrometer to millimeter scale produced on the basis of batch fabrication techniques similar to those used for semiconductor microelectronics devices. MEMS integrate mechanical elements, sensors, actuators, and electronics on a common carrier. MEMS have been developed to sense mechanical, thermal, chemical, radiant, magnetic, and biological quantities and inputs, and produce signals as outputs.

MEMS may have parts moving mechanically under the influence of an energy flow (acoustic, thermal, or optical), a temperature or voltage difference, or an external force or torque. Certain MEMS with a membrane, plate or beam can be used as a pressure sensor or actuator, for instance a microphone or speaker, inertial sensor, for instance an accelerometer, or capacitive sensor, for instance a strain gauge; other MEMS operate as movement sensors for displacement or tilt; bimetal membranes work as temperature sensors. Besides small size, the general requirements for the membrane- or plate-operated sensors include long term stability, small temperature sensitivity, low hysteresis for pressure and temperature, resistance to corrosive ambients, and often hermeticity.

In a MEMS, the mechanically moving parts typically are fabricated together with the sensors and actuators in the process flow of the electronic integrated circuit (IC) on a semiconductor chip. As an example, the mechanically moving parts may be produced by an undercutting etch at some step during the IC fabrication. Bulk micromachining processes employed in MEMS sensor production for creating, in bulk semiconductor crystals, the movable elements and the cavities for their movements include anisotropic wet etching, reactive ion etching (RIE), and deep reactive ion etching (DRIE). These techniques employ photolithographic masking, are dependent on crystalline orientation, and need etch stops, all of which are expensive in terms of time and throughput. In addition, there are bulk and surface micromachining techniques for building up structures in thin films on the surface of semiconductor wafers, also expensive techniques. Other processes, such as automatic wafer bonding, are comparatively inexpensive.

Because of the moving and sensitive parts, MEMS have a need for physical and atmospheric protection. Consequently, MEMS are surrounded by a housing or package, which shields the MEMS against ambient and electrical disturbances, and from environmental stress. For many devices, fully hermetic and even quasi-hermetic packages represent a significant cost, especially when ceramic packages or precision parts such as glass plates are required.

Among the basic operating principles of pressure sensors are piezoresistive, capacitive, and resonant operation. In the piezoresistive operation, the pressure is converted to an electronically detectable signal, wherein the conversion relies on the elastic deformation of a structure such as a membrane exposed to the pressure; pressure causes strain, and strain causes a change in resistance. In MEMS silicon technology, controlling the membrane thickness, size, and alignment involves precision process steps. In the resonant operation, the pressure causes mechanical stress in the vibrating microstructure; the resonance frequency is measured in dependence on the mechanical stress. Excitation and damping of the MEMS silicon diaphragm and the nonlinear frequency-pressure relationship require sophisticated calibration. In the capacitive operation, the pressure causes a displacement-dependent output signal. The change in pressure causes a displacement, the displacement causes a capacitor change, and the capacitor change causes an electrical signal—similar to the operation of a condenser microphone. Nonlinearity and parasitic capacitances and residual membrane stress represent challenges for MEMS membrane fabrication of silicon and epitaxial silicon.

Taking the example of capacitive pressure sensors, several fabrication methods may be chosen. In one method, the sensors are bulk micro-machined as a glass-silicon-glass structure with vertical feed-throughs. In another method, a preferentially etched wafer receives deep and shallow boron diffusions and dielectric depositions, which are mounted on glass so that the wafer can finally be dissolved. In yet another method, a surface micro-machined capacitive pressure sensor is created by a polysilicon layer (1.5 µm thick) separated by a gap (0.8 µm wide) over the n+doped silicon electrode; the sensor is monolithically integrated with the sensing circuitry. The sensors are small and span an operating range from about 1 bar to 350 bar, have high overpressure stability, low temperature dependence and low power consumption.

In the basic operating principle of accelerometers, the mechanical and electrical sensitivity are a function of the displacement of the movable plate's center. In displacement sensing accelerometers, the applied acceleration as input is transformed into the displacement of the movable mass (plate) as output; a suspension beam serves as the elastic spring. Force sensing accelerometers detect directly the force applied on a proof mass. The MEMS fabrication in bulk single-crystal silicon of the movable plate, the suspension beam, and the proof mass requires sensitive semiconductor etching techniques.

SUMMARY OF THE INVENTION

Applicants believe manufacturing cost is the dominant factor preventing the widespread integration of pressure sensors, microphones, accelerometers and other applications in which a movable member is needed to convert an external analog input into an electrical output, into systems of the automotive, medical, and aerospace industries.

Applicants saw that MEMS built on the surface or within the wafer by standard wafer fab technology and standard wafer fab lithographic methods is not only a high cost approach, but also limits the choice of materials and configuration available to the MEMS component, which have to be compatible with the standard wafer process. After the wafer fabrication, in standard technology the MEMS still have to be packaged using known packaging material and processes—another cost adder.

Applicants solved the problem of mass-producing low cost semiconductor-centered MEMS by integrating the movable MEMS parts, such as mechanical elements and sensors including their complete fabrication, with the low-cost device materials and package, and by leaving only the electronics and signal-processing parts in the integrated circuitry. The package, into which the movable parts are integrated, may either be a leadframe-based or a substrate-based plastic molded housing. With this invention, the MEMS may use a standard CMOS chip without any movable structure and a packaging component with movable structures built therein.

Applicants further discovered that the separation of movable and electronics parts provides greater system level integration with other components such as package-on-package MEMS, thus increasing the electrical product efficiency.

In embodiments, which have the movable element integrated into a leadframe-based package, the leadframe may be a prefabricated piece part, or may be fabricated in a process flow with metal deposition on a sacrificial carrier and patterning of the metal layer. In either case, the resulting leadframe may be flat or may have an offset structure, where the metal segments are positioned in more than one plane relative to each other. The latter structure offers especially the thin MEMS, a technical advantage for stacked package-on-package devices.

Embodiments of this invention include the usage of electrostatic force, gravity, air pressure, etc., to deflect a beam or membrane for building microphones, pressure sensors, accelerometers, and other applications where a movable member is needed to convert an external input into an electrical output.

Exemplary MEMS of the pressure sensor family, operating on capacitive changes caused by a movable membrane, may offer 80% lower fabrication cost, when the membrane is integrated into the plastic device package instead of being fabricated in conventional manner as a portion of the silicon chip.

One embodiment of the present invention provides a MEMS comprising a body having a thickness, a first surface, an opposite second surface, and an opening through the thickness of the body extending from the first to the second surface. Metal leads are embedded in the first surface of the body and a metal foil is anchored in the body and extends at least partially across the opening at the first surface. An integrated circuit chip is flip-assembled to the leads on the first surface. The chip spanning at least partially across the foil, and separated from the foil by a gap.

Another embodiment of the present invention provides a method for fabricating a MEMS. The method comprising the steps of providing a leadframe having a first and a second surface, a plurality of leads, and a segment, encapsulating the second leadframe surface in a polymeric compound of a thickness so that an opening through the thickness leaves a portion of the segment's second surface un-encapsulated, thinning the un-encapsulated segment's second surface so that the segment becomes a foil suitable as the movable part of the MEMS, and connecting a semiconductor chip having electronic circuitry on a first chip surface to the first surface of the leads so that the first chip surface spans across the foil, separated from the foil by a gap.

Yet another embodiment of the present invention provides a method for fabricating a MEMS. The method comprising the steps of depositing a metal layer onto a flat sacrificial carrier, the layer having a thinness suitable for membranes of MEMS, patterning the metal layer into a leadframe having a plurality of leads and a segment, encapsulating the leads and the segment in a polymeric compound of a thickness so that an opening through the thickness leaves a portion of the segment un-encapsulated, removing the sacrificial carrier, exposing the encapsulation-free side of the leads and the segment, and connecting a semiconductor chip having electronic circuitry on a first chip surface onto the encapsulation-free side of the leads so that the first chip surface spans the segment, separated from the segment by a gap.

BRIEF DESCRIPTION OF THE DRAWINGS

FIG. 1 illustrates a schematic cross section of an exemplary MEMS of the pressure sensor family operating in the capacitive mode, where the movable membrane is part of the plastic leadframe-based package. In the example shown, all leads and the membrane lay in the same plane.

FIG. 4 depicts an exemplary package-on-package device stacked by solder bodies, which includes a pressure sensor MEMS fabricated according to an embodiment of the invention.

FIG. 5 is a schematic cross section of an exemplary MEMS of the pressure sensor family operating in the capacitive mode, where the movable membrane is part of the plastic leadframe-based package. In the example shown, the lead set intended for connection to external parts is in a plane offset from the plane of the membrane and other sets of leads.

FIG. 6 shows another package-on-package device stacked by pressure (touch) contacts, which includes an inertial sensor (accelerometer) MEMS fabricated according to another embodiment of the invention.

FIG. 7A is a schematic cross section of the patterned leadframe with membrane and leads in a single plane.

FIG. 7B is a schematic cross section of the MEMS after the process step of covering one side of the leadframe with encapsulation compound, while leaving the membrane uncovered.

FIG. 7C is a schematic cross section of the completed MEMS.

FIG. 8A is a schematic cross section of the bare sacrificial carrier.

FIG. 8B is a schematic cross section of the carrier after depositing photoresist layers on both sides of the carrier and patterning the photoresist layer on one side.

FIG. 8C is a schematic cross section of the carrier after filling the photoresist pattern with metal layers.

FIG. 8D is a schematic cross section of the carrier with the metal layer pattern after removing the photoresist.

FIG. 8E is a schematic cross section of the carrier with the metal layers after the process step of covering one side with encapsulation compound while leaving the metal of the future membrane uncovered.

FIG. 8F is a schematic cross section of the MEMS after the process step of removing the sacrificial carrier.

FIG. 8G is a schematic cross section of the completed MEMS.

FIGS. 9A to 9H illustrate certain process steps of another fabrication flow for a pressure sensor MEMS with the movable membrane integrated in the leadframe-based plastic package and positioned in a plane with certain sets of the leads.

FIG. 9A is a schematic cross section of the bare sacrificial carrier.

FIG. 9B is a schematic cross section of the carrier after depositing photoresist layers on both sides of the carrier and patterning the photoresist layer on one side.

FIG. 9C is a schematic cross section of the carrier after filling the photoresist pattern with metal layers.

FIG. 9D is a schematic cross section of the carrier with the metal layer pattern after removing the photoresist.

FIG. 9E is a schematic cross section of the carrier with the patterned metal layers after the process step of pressing the carrier so that one set of the metal layers is in a plane offset from the original plane of the other sets of the metal layer and the future membrane.

FIG. 9F is a schematic cross section of the carrier with the metal layers after the process step of covering one side with encapsulation compound while leaving the metal of the future membrane uncovered.

FIG. 9G is a schematic cross section of the MEMS after the process step of removing the sacrificial carrier.

FIG. 9H is a schematic cross section of the completed MEMS.

FIG. 10A is a schematic cross section of the patterned leadframe with the future membrane and certain lead sets in one plane and another lead set in an offset plane.

FIG. 10B is a schematic cross section of the MEMS after the process step of covering one side of the leadframe with encapsulation compound, while leaving the membrane uncovered.

FIG. 10C is a schematic cross section of the completed MEMS.

DETAILED DESCRIPTION OF THE PREFERRED EMBODIMENTS

Figure 2:
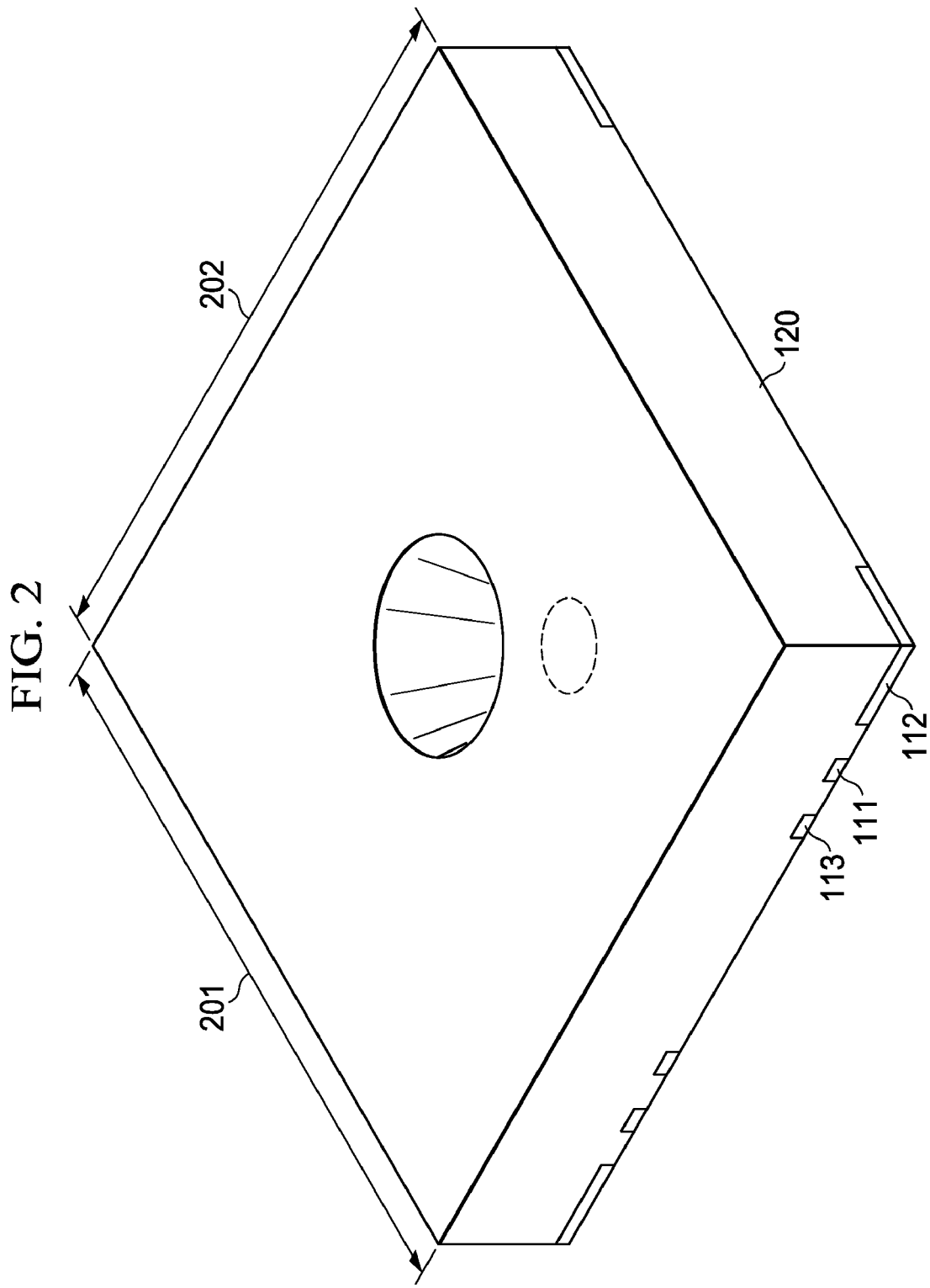
FIG. 2 shows a schematic perspective view of a finished MEMS of the exemplary type in FIG. 1, illustrating the plastic package.

FIG. 1 illustrates a schematic cross section of an exemplary embodiment of the invention showing a micro-electro-mechanical system (MEMS) of the pressure sensor family, which operates in the capacitive mode with displacement-dependent output signals. The exemplary MEMS, generally designated 100 in FIG. 1, is a system structured like QFN (Quad Flat No-Lead) and SON (Small Outline No-Lead) type semiconductor devices. In the embodiment of FIG. 1, an integrated circuit chip 101 is assembled on metallic leads; these leads together with other leads represent the plurality designated 110 in FIG. 1. The leads, in turn, are embedded in a plastic body designated 120, preferably made of molding compound. The leads and the plastic body represent the package for chip 101. Further embedded in the plastic body is the movable part of the MEMS, designated 130 in FIG. 1. Chip 101 is separated from the movable part 130 of the package by gap 107. The chip 101 in FIG. 1 is flip-assembled onto the package. Flip-assembly typically utilizes conductive spacers such as solder balls or solder bodies to mechanically and electrically attach a chip surface, on which an integrated circuit has been formed, to an opposing surface of a substrate which interconnects multiple integrated circuits or other electrical components. In this embodiment, the substrate provides the movable part of the MEMS and electrical connection to external systems.

In FIG. 1, the plastic body 120 has an overall thickness 121, a first surface 120a and an opposite second surface 120b. Preferably, plastic body 120 is fabricated by a molding technique (for instance transfer molding) using an epoxy-based molding compound; the compound is hardened by polymerization to give mechanical strength to device 100. Preferably, the compound includes inorganic filler particles (such as silicon dioxide or silicon nitride) of about 80 to 90% by volume in order to better match the coefficient of thermal expansion (CTE) of the compound to the CTE of silicon.

Through the thickness 121 of body 120 is an opening 122, which extends from the first surface 120a to the second surface 120b. Opening 122 may be shaped as a cylinder or, as shown in FIG. 1, as a truncated cone, or in any other suitable stereometrical form. At the side of first surface 120a, opening 122 has a diameter 123. In the embodiment of FIG. 1, the movable part 130 stretches across diameter 123 and is anchored in plastic body 120 in x- and y-directions along the circumference of the opening. In other embodiments (see below), the movable part extends only partially across the opening 123.

Movable part 130 typically is made of metal such as copper or nickel, often with the surface facing chip 101 made of palladium or gold. Alternatively, movable part 130 may be made of an iron-nickel alloy (such as Alloy 42 or Invar™) or of aluminum. For some MEMS, movable part 130 has the same thickness 114 as leads 110. For many embodiments, the thickness of the movable part 130 is between about 5 and 50 µm. Preferred thickness is between about 10 and 25 µm, but may be thicker or thinner in other embodiments. In this thickness range, movable part 130 can act as a membrane, which is flexible in the z-direction, movable in the space of the opening 122 and of the gap 107. As a membrane, part 130 is sensitive to external pressure changes arriving from z-direction through opening 122, bending the membrane inward and outward of gap 107. In some embodiments, movable part 130 has an area between about 0.5 and 2.3 mm$^2$; in other embodiments, the area may be smaller or larger.

Leads 110 typically are made of copper or nickel, sometimes with the surface facing chip 101 made of palladium or gold; alternatively, leads 110 may be made of an iron-nickel alloy such as Alloy 42, or Invar™, or of aluminum. The plurality of leads 110 in FIG. 1 may be grouped in sets. The leads of the first set, designated 111, enable electrical interconnection between the movable part 130 and the integrated circuit of chip 101. The leads of the second set, designated 112, enable contacts to external parts; they allow the attachment of solder balls 140. The leads of the third set, designated 113, are configured as a metal seal ring encircling the opening 122. As FIG. 1 indicates, the leads of the first, second, and third set are aligned in one plane, and the movable part 130 is positioned in the same plane.

Chip 101 includes a metallic monitoring plate 108, for instance made of copper, facing the movable part 130 across the distance 107a. Monitoring plate 108 on the circuitry-side 101a of the chip is parallel to movable part 130 and typically has the same area as movable part 130; areas often are between about 0.5 and 2.25 mm$^2$. Chip 101 further has a plurality of contact pads 102, typically made of copper between about 10 and 50 µm thick. In the embodiment of FIG. 1, the chip is attached to the package leads by solder bodies 109, created by reflowing a solder alloy so that a gap 107 is formed between movable part 130 and plate 108. In the chip attachment, electrical pads 102 are aligned with the leads 111 of the first set, and the metallic seal-ring shaped pad 103 is aligned with metal seal ring 113 of the third lead set.

In an alternative embodiment, instead of copper chip pads 102 and solder bodies 109, gold bumps may be used; they may be produced by a wire ball bonding technique, followed by a flattening process with a coining technique. In another alternative embodiment, a low-melting gold eutectic may be used instead of the gold bumps, for instance the gold/germanium eutectic (12.5 weight % Ge, eutectic temperature 361° C.).

In one embodiment, gap 107 has a distance 107a between about 10 and 60 μm, with a typical distance of about 25 μm. The thickness 114 of the movable part 130 and of the leads 111, 112 and 113 is preferably between about 10 and 25 μm, but may be thinner or thicker in other embodiments. The thickness of the membrane as well as the gap between membrane and the sensing plate can be dimensioned to meet the desired sensitivity of the pressure sensor as discussed below.

After the leads 113 of the third set are attached to the matching seal ring-shaped pad 103 by solder ring 150, the space of gap 107 is sealed quasi-hermetically. Gap space 107 is protected against environmental disturbances such as particles, but not completely against water molecules, due to the use of a plastic compound for body 120. Alternatively, when a ceramic material is used to create the package for device 100, gap space 107 is hermetically sealed.

In alternative embodiments, the sealing of ring 150 can be provided by materials other than solder. Such sealant materials include glass, epoxy, eutectic metal alloys, and diffusion alloys, and other suitable materials.

Sensing plate 108 and membrane 130, typically having the same area and being separated by a gap, form a capacitor. As stated above, membrane 130 is made of a metal, for example, copper, in a thinness, for example 10 μm, to be flexible and sensitive to pressure changes. The assembled device 100, therefore, works as a pressure sensor or a microphone. Responding to pressure arriving through opening 122 by bending inward and outward, membrane 130 modifies distance 107a relative to stationary plate 108. Let the area of membrane 130, and plate 108, as electrodes be A; the distance between the electrodes under original pressure be $D_o$; and the dielectric constant of the space between the electrodes be $\in$, then the capacitance C of the electrodes is given by $$C = \in \cdot A / D_o.$$

Pressure in z-direction deforms the flexible membrane so that the deformed area has to be calculated as an integral over small area elements dx dy, while the distance $D_o$ is modified in both x-direction and y-direction by a deflection $w_{x,y}$. The resulting change of capacitance is measured by the circuitry of chip 101.

In order to give a cost estimate for the exemplary pressure sensor MEMS, FIG. 2 illustrates the overall body size with side lengths 201 and 202. The side lengths of the molded material 120 may be 3 by 3 mm, 4 by 4 mm, 3 by 4 mm, or any other size desired by customers. The base material of the leads (111, 112, and 113) and the membrane (not shown in FIG. 2) may be copper, aluminum, or an iron alloy. The cost of the molded package, including the movable part, in mass production is about $0.10. With the added cost of the chip about $0.009, the total cost of the MEMS in a plastic package including the movable part according to the invention is about $0.109. This cost compares to the cost of a conventional pressure sensor MEMS of the same body sizes and a FR-4 based substrate material as follows: The cost of the conventional package is about $ 0.54; the cost of the chip including the movable part is about $0.017; the total cost of the MEMS is about $0.557. This cost is approximately five-fold the cost of the MEMS according to the invention.

Figure 3:
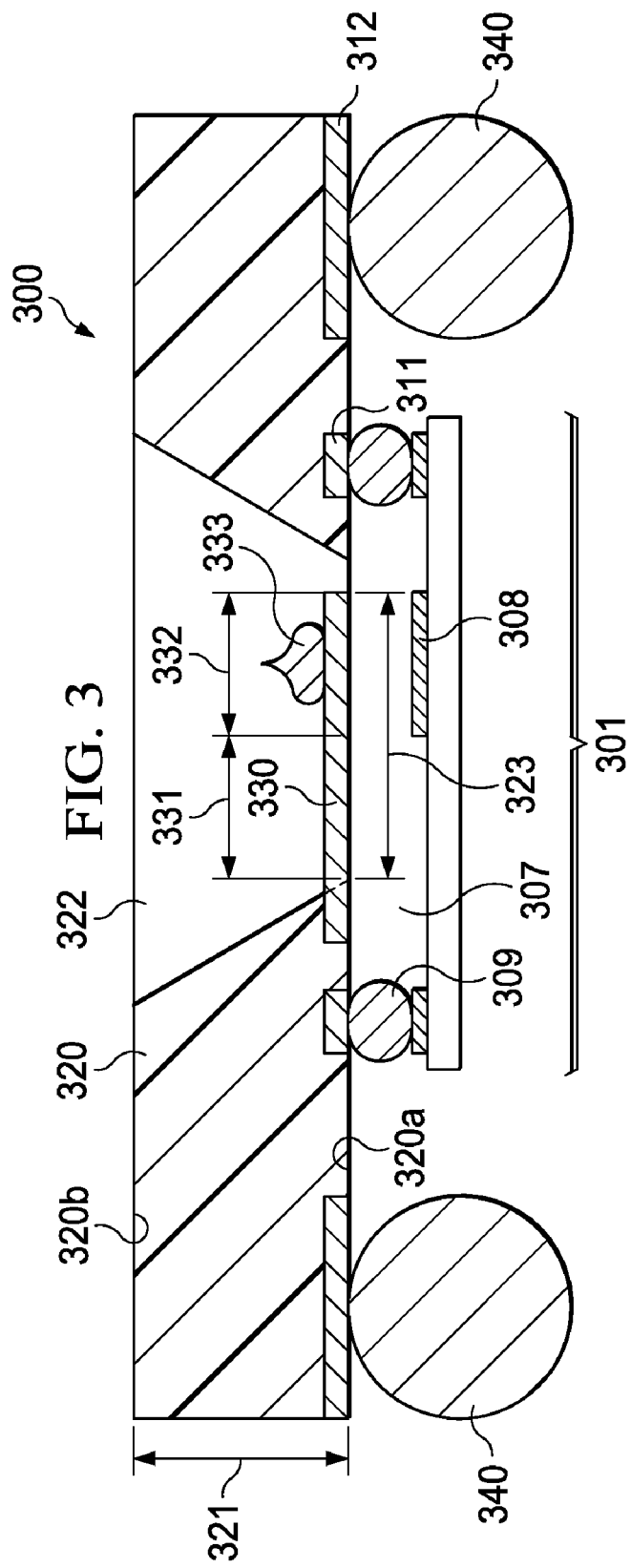
FIG. 3 depicts a schematic cross section of an exemplary MEMS of the inertial sensor family operating as a capacitive accelerometer, where the movable plate is part of the plastic leadframe-based package. In the example shown, all leads, the suspension beam, and the movable plate lay in the same plane.

FIG. 3 illustrates another embodiment of the invention showing a MEMS of the inertial sensor family, which operates as a capacitive accelerometer. In these sensors, acceleration is transformed into the displacement of a movable mass or plate; the position change is measured as a change of the capacitance relative to a fixed plate. Capacitive accelerometers exhibit high sensitivity, good DC response and noise performance, low drift, and low power dissipation and temperature sensitivity.

The example of FIG. 3 shows a simplified, low cost version, where the cavity is not sealed but open. The exemplary MEMS, generally designated 300 in FIG. 3, is a device structured like QFN and SON type semiconductor devices. In the embodiment of FIG. 3, an integrated circuit chip 301 is flip-assembled on metallic leads 311 of a first set. The first set leads are embedded in a plastic body 320, preferably made of molding compound. The leads and the plastic body represent the package for chip 301. Further embedded in the plastic body is the movable plate 330 of the MEMS and the leads 312 of a second set, which enable contacts to external parts; they especially allow the attachment of solder balls 340. Chip 301 is separated from the movable part 330 of the package by gap 307, preferably about 10 to 60 μm wide, more preferably about 25 μm.

In FIG. 3, the plastic body 320 has an overall thickness 321, a first surface 320a and an opposite second surface 320b. Plastic body 320 typically is fabricated by a molding technique, for instance transfer molding, using an epoxy-based molding compound. The compound may be hardened by polymerization to give mechanical strength to device 300.

Through the thickness 321 of body 320 is an opening 322, which extends from the first surface 320a to the second surface 320b. Opening 322 may be shaped as a cylinder or, as shown in FIG. 3, as a truncated cone, or in any other suitable stereometrical form. At the side of first surface 320a, opening 322 has a diameter 323. In the embodiment of FIG. 3, a movable part 330 stretches partially across diameter 323 and is anchored in the first surface 320a of the plastic body 320.

Movable part 330 typically is made of metal such as copper or nickel. Alternatively, movable part 330 may be made of an iron-nickel alloy (such as Alloy 42 or Invar™) or of aluminum. Movable part 330 typically has the same thickness as leads 311 and 312. For many embodiments, the thickness of the movable part 330 is between about 5 and 50 μm. Preferred thickness is between about 10 and 25 μm, but may be thicker or thinner in other embodiments. In this thickness range, movable part 330 is flexible in the direction normal to the first surface and movable in the space of the opening 322 and of the gap 307. In some embodiments, movable part 330 includes the suspension beam of length 331 and the movable plate of length 332. Movable plate 332 has an area equal to the area of the fixed plate 308 on the chip surface in order to form a capacitor. In addition, for some embodiments the mass of the movable plate 332 can be enlarged by adding the mass of a deformed gold sphere, as formed in the well-known wire ball bond process, to the plate 332.

Leads 311 and 312 and movable part 330 typically are made of copper or nickel; alternatively, the leads and part 330 may be made of an iron-nickel alloy such as Alloy 42, or Invar™, or of aluminum (leadframe approach, see below). As mentioned, the plurality of leads may be grouped in sets. The leads of the first set, designated 311, enable electrical interconnection between the movable part 330 and the integrated circuit of chip 301. The leads of the second set, designated 312, enable contacts to external parts; they especially allow the attachment of solder balls 340. The thickness of the leads and the movable part is preferably between about 5 and 25 µm, but may be thinner or thicker in some embodiments. The leads of the first and second sets are aligned in one plane, and the movable part 330 is positioned in the same plane.

The invention allows the selection of the materials and dimensions for opening 322, length of suspension beam 331, area of movable plate 332, mass 333, and capacitance between movable plate 332 and fixed plate 308. Consequently, the accelerometer of FIG. 3 can be specialized as a capacitive displacement sensing accelerometer, which transforms acceleration into the displacement of a movable mass, or as a force sensing accelerometer, which detects directly the force applied on a proof mass. The mechanical transfer function of the selected components relates applied acceleration as the input to the displacement of the mass (movable plate 332 and mass 333) as the output. The components of FIG. 3 allow a designed distribution of the output between the additive forces: inertial force, elastic force, and damping force.

Embodiments such as the examples displayed in FIG. 1 and FIG. 3 lend themselves to stacking of devices. FIG. 4 shows an exemplary package-on-package device stacked by solder bodies 140 and 440, which includes a pressure sensor MEMS 100 as described in conjunction with FIG. 1. Components 401 and 402 are overmolded devices of the ball grid array families. Analogous package-on-package devices can be constructed with an inertial sensor MEMS 300 as described in conjunction with FIG. 3.

FIG. 5 illustrates another exemplary embodiment 500 of the invention showing a MEMS of the pressure sensor family, which operates in the capacitive mode with displacement-dependent output signals. The exemplary MEMS is a device structured like plastic-encapsulated, leadframe-based QFN and SON type semiconductor devices. The plastic body of the encapsulation, designated 520, has an opening 522. The movable, membrane-like part, designated 530, extends across the opening 522. The flip-attached semiconductor device, designated 101, is parallel to the movable membrane 530. Device 101 includes a metallic sensing plate 508, for instance made of copper, facing the movable part 530 across gap 507. The height of gap 507 may be between about 10 and 60 µm, typically about 25 µm. Sensing plate 508 on the circuitry-side 101a of device 101 is parallel to movable part 530 and typically has the same area as movable part 530; areas typically are between about 0.5 and 2.3 mm$^2$.

In the embodiment of FIG. 5, the metal leads, embedded in the plastic body 520, are made of copper or nickel, alternatively of an iron-nickel alloy such as Alloy 42, or Invar™, or of aluminum or other suitable material. The plurality of leads in FIG. 5 may be grouped in sets. The leads of the first set, designated 511, enable electrical interconnection between the movable part 530 and the integrated circuit of chip 101. The physical interconnection between leads 511 and chip 101 is accomplished by solder bodies 509. The leads of the second set, designated 512, enable contacts to external parts; these contacts may have a surface metallurgy suitable for pressure contacts, or they may have a surface metallurgy suitable for attaching solder balls. The leads of the third set, designated 513, are configured as a metal seal ring encircling the opening 522. The physical interconnection between leads 513 and chip 101 is accomplished by solder ring 550, which has the same height as solder bodies 509.

In an alternative embodiment, instead of copper chip pads 502 and solder bodies 509, gold bumps may be used; they may be produced by a wire ball bonding technique, followed by a flattening process with a coining technique. In another alternative embodiment, a low-melting gold eutectic may be used instead of the gold bumps, for instance the gold/germanium eutectic (12.5 weight % Ge, eutectic temperature 361° C.).

As FIG. 5 indicates, the leads 511 and 513 of the first and third sets (and the movable part 530) are aligned in a first plane 561, the leads 512 of the second set, however, are positioned in a second plane 562 offset from the first plane. The size of his offset 560 is selected so that the total thickness of chip 101 together with the height of solder bodies 509 fit into the offset 560. Consequently, the plane of chip surface 101b, opposite the circuitry-side 101a, does not protrude from the plane 562 of the surface of leads 512.

Plastic body 520 of MEMS 500 is preferably fabricated by a molding technique (for instance transfer molding) using an epoxy-based molding compound; the compound is hardened by polymerization to give mechanical strength to device 500. As mentioned, plastic body 520 has an opening 522, which extends from the first surface 520a to the second surface 520b. Opening 522 may be shaped as a cylinder or, as shown in FIG. 5, as a truncated cone, or in any other suitable stereometric form. At the side of first surface 520a, opening 522 has a diameter 523. In the embodiment of FIG. 5, the movable part 530 stretches across diameter 523 and is anchored in plastic body 520 in x- and y-directions along the circumference of the opening. In other embodiments (for instance analogous to FIG. 3), the movable part extends only partially across the opening 523.

Movable part 530 typically is made of metal such as copper or nickel, optionally with the surface facing chip 101 made of palladium or gold. Alternatively, movable part 530 may be made of an iron-nickel alloy (such as Alloy 42 or Invar™) or of aluminum. Movable part 530 typically has the same thickness as leads 511, 512, and 513. For many embodiments, the thickness of the movable part 530 is between about 5 and 50 µm. Preferred thickness is between about 10 and 25 µm, but may be thicker or thinner in other embodiments. In this thickness range, movable part 530 can act as a membrane, which is flexible in the z-direction, movable in the space of the opening 522 and of the gap 507. As a membrane, movable part 530 is sensitive to external pressure changes arriving from z-direction through opening 522, bending the membrane inward and outward of gap 507. In some embodiments, movable part 530 has an area between about 0.5 and 2.3 mm$^2$; in other embodiments, the area may be smaller or larger.

After the leads 513 of the third set are attached to the matching seal ring-shaped pad 503 by solder ring 550, the space of gap 507 is sealed quasi-hermetically. Gap space 507 is protected against environmental disturbances such as particles, but not completely against water molecules, due to the use of a plastic compound for body 520. Alternatively, when a ceramic material is used to create the package for device 500, gap space 507 is hermetically sealed.

Embodiments such as the example displayed in FIG. 5 lend themselves to stacking of devices. FIG. 6 shows an exemplary package-on-package device 600 stacked by forming surface-to-surface touch contact between conducting terminals of two individual devices. Since such contacts work most reliably when held under slight pressure, these contacts are frequently referred to as pressure contacts. One of the packages is an inertial sensor MEMS 601, the other package 602 is an overmolded device of a ball grid array family. MEMS 601 combines the features of a capacitive accelerometer, as discussed in conjunction with the device in FIG. 3, with the features of the leadframe-based package, as discussed in conjunction with the device in FIG. 5.

Schematic FIG. 7A through 10C describe steps of several process flows for fabricating exemplary leadframe-based MEMS having the movable elements integrated into the device packages. FIGS. 7A to 7C and FIGS. 8A to 8G display steps of process flows for fabricating pressure sensor and inertial sensor MEMS with the leads in a single plane, FIGS. 9A to 9H and FIGS. 10A to 10C display steps of process flows for fabricating pressure sensor and inertial sensor MEMS with the leads in offset planes. The MEMS of all process flows have thin movable parts. However, the thickness of the leads of a MEMS fabricated by the flow of FIGS. 7A to 7C may be greater than the leads of a MEMS fabricated by the flow of FIGS. 8A to 8G. Similarly, the thickness of the leads of a MEMS fabricated by the flow of FIGS. 10A to 10C may be greater than the leads of a MEMS fabricated by the flow of FIGS. 9A to 9H.

Figure 7A:
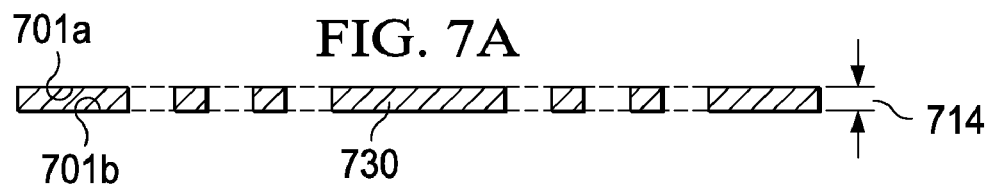
FIGS. 7A to 7C illustrate certain process steps of a fabrication flow for a pressure sensor MEMS with the movable membrane integrated in the leadframe-based plastic package and positioned in a single plane with all leads.

In FIG. 7A, a leadframe including the plurality of leads and a segment-to-become-membrane is patterned by stamping or etching from a flat metal sheet with a typical range of thickness 714 from 100 to 200 µm, often about 150 µm. According to one embodiment, the sheet is made of copper, copper alloy, or aluminum. Alternatively, an iron-nickel alloy (Alloy 42 or Invar™) or another suitable metal may be selected. The flatness of the base sheet causes leads and segment to be in a single plane. Surface 701a of the sheet can be oxidized or roughened for improved adhesion to polymeric encapsulation compounds, while surface 701b can have a thin layer of nickel and an outermost layer of a noble metal such as gold or palladium for improved solderability. Segment 730 of the leadframe may have a much larger area than indicated by schematic FIG. 7A, in order to become the sensitive membrane of a MEMS.

Figure 7B:
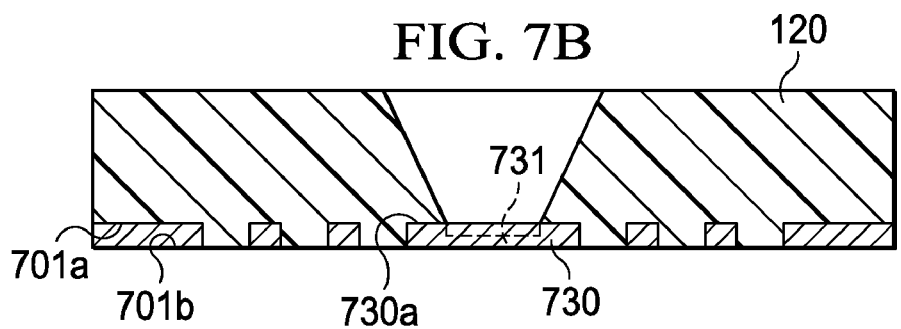

In the next process step, FIG. 7B, a plastic body 120 is fabricated on the surface 701a of the patterned leadframe to encapsulate the leadframe, unifying the leads and membrane into a device and providing strength and robustness to the leadframe. The typical fabrication process uses a transfer molding technology and epoxy-based molding compound with inorganic fillers. In the case of molding, the steel of the mold has a protrusion reaching into the cavity so that the segment 730 of the leadframe remains free of the encapsulation compound, when the cavity is filled with the compound, except for peripheral portions 730a needed for anchoring the metal of segment 730 in body 120. For inertial sensor MEMS, for which a beam or a plate need to be fastened, the anchoring may only affect a local portion of the periphery of segment 730. For pressure sensor MEMS, for which a membrane needs to be fastened, the anchoring may affect the whole periphery of segment 730. During the encapsulation process, surface 701b of the leadframe may be shielded by a plastic film to stay free of compound; the film is peeled from surface 701b after completion of the molding step.

In the next process step, the metal portion of area 730 free of encapsulation compound is etched to thin the metal from sheet thickness 714, typically between about 100 and 200 µm, to a thickness range of about 5 to 50 µm, typically between about 10 and 25 µm, in order to enhance the flexibility of segment 730 as the membrane of the MEMS. In FIG. 7B, the thin portion of the etched membrane is designated 731.

Figure 7C:
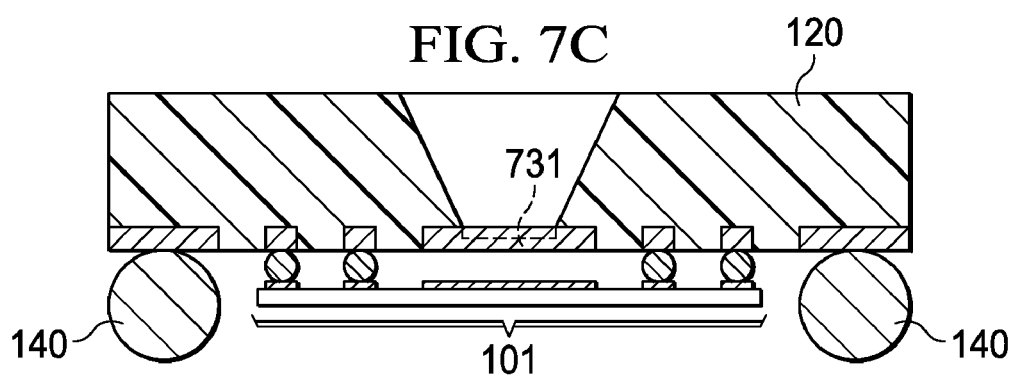

In the process steps of FIG. 7C, semiconductor device 101 is attached to the respective leads and solder balls 140 are attached to the leads for connection to externals parts. The finished MEMS of FIG. 7C resembles the device of FIG. 1 except for the thinned portion 731 of the membrane.

Figure 8A:
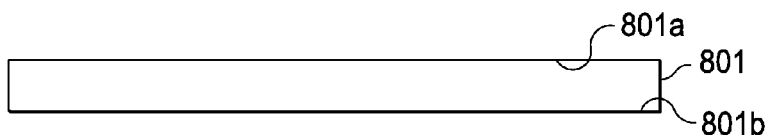
FIGS. 8A to 8G illustrate certain process steps of another fabrication flow for a pressure sensor MEMS with the movable membrane integrated in the leadframe-based plastic package and positioned in a single plane with the leads.
Figure 8B:
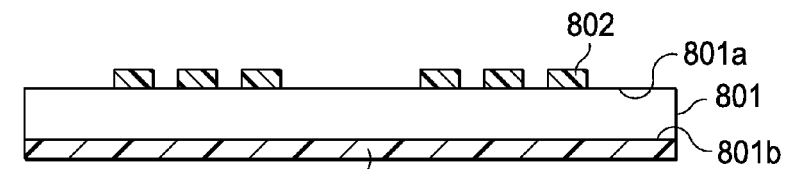

For the process flow shown in FIGS. 8A to 8G, the process starts in FIG. 8A by selecting a flat sacrificial carrier 801. The sacrificial carrier may be a substrate of bare copper or bare aluminum with an exemplary thickness between 100 and 200 µm; alternatively, carrier 801 may be any other suitable material, which can be dissolved by etching after the conclusion of the process. Next, a photoresist layer is deposited on each carrier surface 801a and 801b (see FIG. 8B). The layer 802 on surface 801a will then be patterned by masking, developing and etching, while the layer 803 on surface 801b remains unpatterned. The etched openings include the locations for the future contact pads 811 and 812, and the future ring-shaped seal pad 813.

Figure 8C:
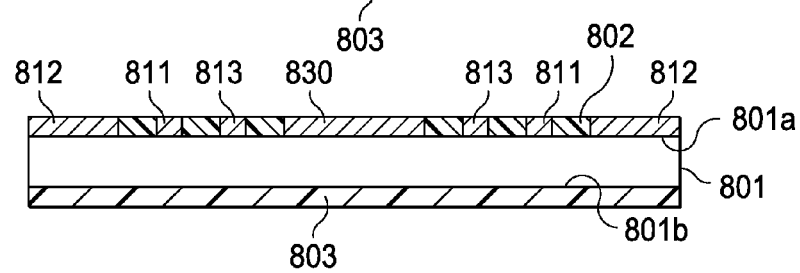
Figure 8D:
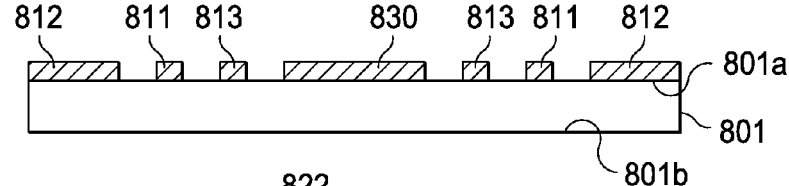

In the step depicted in FIG. 8C, one or more metal layers are deposited on the carrier surface 801a in each opening of the patterned photoresist. The metal layers are designated (in analogy to FIG. 1) as segments 811, 812, 813, and 830. One deposition technique is a plating process. Typical metals include a layer of a solderable metal, such as palladium or gold, in contact with carrier surface 801a followed by an outermost layer of nickel; alternatively, any other suitable metal, such as copper or aluminum, or a metal alloy may be chosen. The final layer surface may be rough and should exhibit chemical affinity to adhere to polymeric compounds; one method includes metal oxide formation. The total layer thickness is the same for all segments 811, 812, 813 and 830 and typically is between 7 and 25 µm; it may be equal to or thinner than the thickness of photoresist layer 802. Thereafter, the photoresist layers 802 and 803 are removed; see FIG. 8D.

Figure 8E:
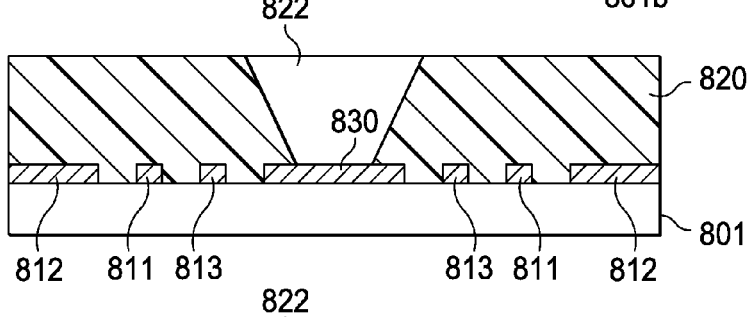

In the next process step, illustrated in FIG. 8E, encapsulation material 820 is deposited over the features on carrier side 801a; the deposition is formed so that cavity 822 remains open, exposing most of the area of segment 830 while sealing the perimeter of segment 830. The typical encapsulation process is a transfer molding technique, and the typical encapsulation material is an epoxy-based polymeric molding compound selected so that the compound adheres strongly to the top metal of segments 811, 812, 813 and 830. As stated above, steel hillocks protruding into the mold cavity used for transfer molding technology offer a low cost way to prevent a filling of opening 822 with compound. After the molding step, the polymeric compound is hardened by polymerization, resulting in a sturdy package for the MEMS.

Figure 8F:
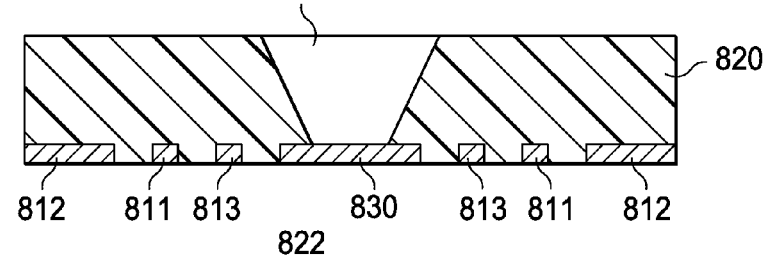
Figure 8G:
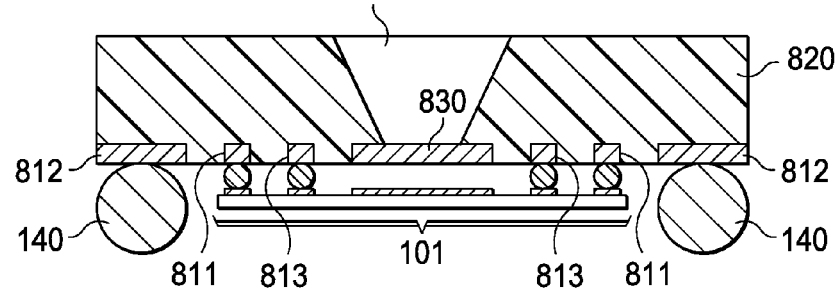

In FIG. 8F, carrier 801 is removed by a method such as chemical etching, thereby exposing the solderable surfaces, such as noble metals, of the metal layers 811, 812, and 813. In the remaining process steps (see FIG. 8G), semiconductor device 101 is attached by solder bodies to the respective layers 811 and seal ring 813, and solder balls 140 are attached to layers 812. In the resulting MEMS, metal layer 830 has already the thinness required to operate as a membrane in a pressure sensor and microphone.

For the process flow shown in FIGS. 9A to 9H, the process starts in FIG. 9A by selecting a flat sacrificial carrier 901. The sacrificial carrier may be a substrate of bare copper or bare aluminum with an exemplary thickness between 100 and 200 µm; alternatively, carrier 901 may be any other material suitable for stamping or pressing into a shape offset from flat, and then for dissolving in an etchant after the conclusion of the process. Next, a photoresist layer is deposited on each carrier surface 901a and 901b (see FIG. 9B). The layer 902 on surface 901a will then be patterned by masking, developing and etching, while the layer 903 on surface 901b remains un-patterned. The etched openings include the locations for the future contact pads 911 and 912, and the future ring-shaped seal pad 913.

In the step depicted in FIG. 9C, one or more metal layers are deposited on the carrier surface 901a in each opening of the patterned photoresist. The metal layers are designated (in analogy to FIG. 5) as segments 911, 912, 913, and 930. The typical deposition technique is a plating process. Suitable metals include a layer of a solderable metal, such as palladium or gold, in contact with carrier surface 901a, followed by an outermost layer of nickel. Other suitable metals, such as copper or aluminum, or a metal alloy may be chosen. The final layer surface may be rough and should exhibit chemical affinity to adhere to polymeric compounds; one method includes metal oxide formation. The total layer thickness is the same for all segments 911, 912, 913 and 930 and typically is between 7 and 25 μm; it may be equal to or thinner than the thickness of photoresist layer 902. Thereafter, the photoresist layers 902 and 903 are removed; see FIG. 9D.

In the next process step, shown in FIG. 9E, a stamping equipment is used to press carrier 901 into an offset shape so that the carrier portions for metal segments 912 are positioned into a plane offset from the original plane for metal segments 911, 913, and 930. The height 960 of the offset is selected so that chip 101 can be flip-attached to the respective segments without protruding from the offset plane of segments 912.

In the next process step, illustrated in FIG. 9F, encapsulation material 920 is deposited over the features on carrier side 901a; the deposition is formed so that cavity 922 remains open, exposing most of the area of segment 930 while sealing the perimeter of segment 930. One encapsulation process is a transfer molding technique, and a typical encapsulation material is an epoxy-based polymeric molding compound selected so that the compound adheres strongly to the top metal of segments 911, 912, 913 and 930. As stated above, steel hillocks protruding into the mold cavity used for transfer molding technology offer a low cost way to prevent a filling of opening 922 with compound. After the molding step, the polymeric compound may be hardened by polymerization, resulting in a sturdy package for the MEMS.

In FIG. 9G, carrier 901 is removed by a method such as chemical etching, thereby exposing the solderable surfaces, such as noble metals, of the metal segments 911, 912, and 913. In the remaining process steps (see FIG. 9H) semiconductor device 101 is flip-attached by solder bodies to the respective segments 911 and seal ring 913. The finished MEMS has pressure contacts, or touch contacts, 912 for connections to external parts. In the resulting MEMS, metal segment 930 has already the thinness required to operate as a membrane in a pressure sensor and microphone. For other MEMS, such as shown in FIG. 6, segment 930 has the thinness required to operate as a capacitive accelerometer of an inertial sensor MEMS family.

Figure 10A:
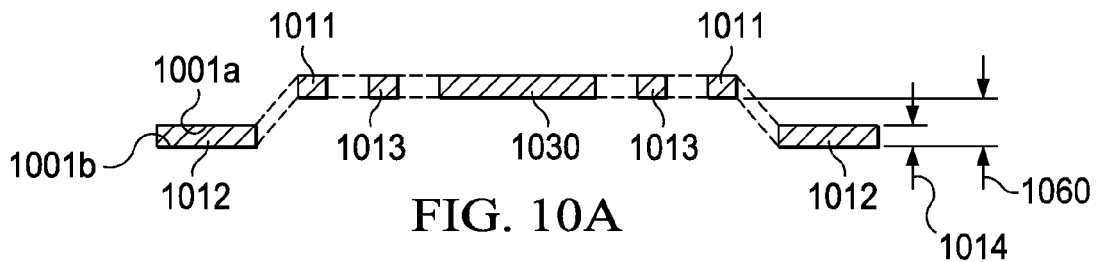
FIGS. 10A to 10C illustrate certain process steps of another fabrication flow for a pressure sensor MEMS with the movable membrane integrated in the leadframe-based plastic package and positioned in a plane with certain sets of the leads.

In FIG. 10A, a leadframe including the plurality of leads and a segment-to-become-membrane 1030 is patterned by stamping or etching from a flat metal sheet with a typical range of thickness 714 from 100 to 200 μm, commonly about 150 μm. Simultaneous with, or subsequent to, the patterning step, the leadframe is stamped into the offset shape shown in FIG. 10A, wherein the segments 1012 are in a plane different from the plane of leads 1011, 1013, and segment 1030. The height 1060 of the offset is selected so that chip 101 can be flip-attached (see FIG. 10C) to the respective segments without protruding from the offset plane of segments 1012. The sheet typically is made of copper, copper alloy, or aluminum. Alternatively, an iron-nickel alloy (Alloy 42 or Invar™) or another suitable metal may be selected. Surface 1001a of the sheet can be oxidized or roughened for improved adhesion to polymeric encapsulation compounds, while surface 1001b can have a thin layer of nickel and an outermost layer of a noble metal such as gold or palladium for improved solderability. Segment 1030 of the leadframe may have a much larger area than indicated by schematic FIG. 10A, in order to become the sensitive membrane of a MEMS.

Figure 10B:
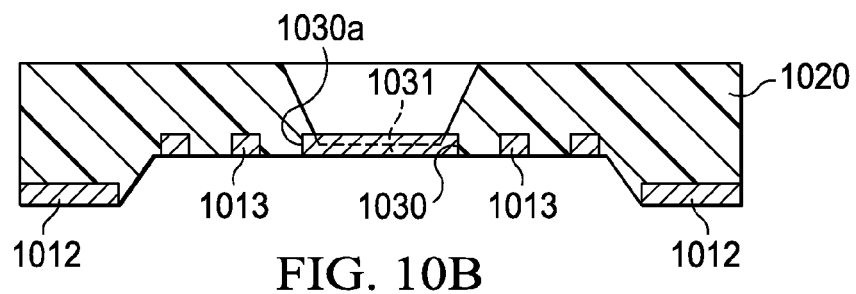
Figure 10C:
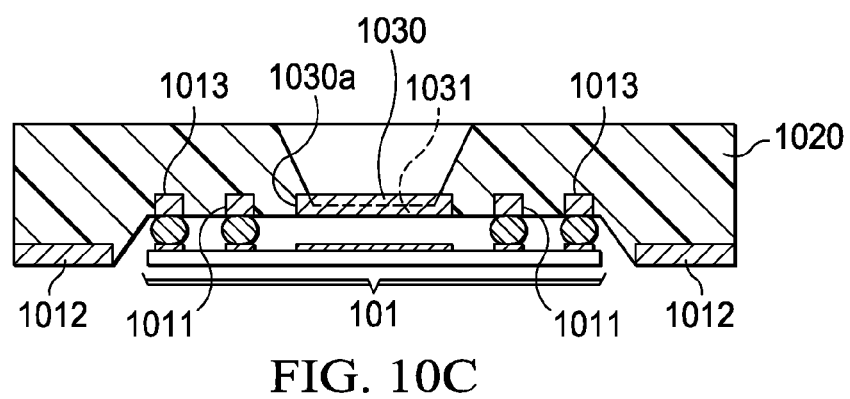

In the next process step, FIG. 10B, a plastic body 1020 is fabricated on the surface 1001a of the patterned leadframe to encapsulate the leadframe, unifying the leads and membrane into a device and providing strength and robustness to the leadframe. One fabrication process is a transfer molding technology using an epoxy-based molding compound with inorganic fillers. In the case of molding, the steel of the mold has a protrusion reaching into the cavity so that the segment 1030 of the leadframe remains free of the encapsulation compound, when the cavity is filled with the compound, except for peripheral portions 1030a needed for anchoring the metal of segment 1030 in body 1020. For inertial sensor MEMS, for which a beam or a plate need to be fastened, the anchoring may only affect a local portion of the periphery of segment 730. For pressure sensor MEMS, for which a membrane needs to be fastened, the anchoring may affect the whole periphery of segment 730. During the encapsulation process, surface 1001b of the leadframe may be shielded by a plastic film to stay free of compound; the film is peeled from surface 1001b after completion of the molding step.

In the next process step, the metal portion of area 1030 free of encapsulation compound is etched to thin the metal from sheet thickness 1014 between about 100 and 200 μm to a thickness range of about 5 to 50 μm, typically between about 10 and 25 μm, in order to enhance the flexibility of segment 1030 as the membrane of the MEMS. In FIG. 10B, the thin portion of the etched membrane is designated 1031. In the process step of FIG. 10C, semiconductor device 101 is attached to the respective leads. The finished MEMS of FIG. 10C resembles the device of FIG. 9H.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to any material for the MEMS package, including plastics and ceramics, and the semiconductor device, integrated circuits as well as discrete devices, including silicon, silicon germanium, gallium arsenide, or any other semiconductor or compound material used in manufacturing.

As another example, the integration of the movable element into the leadframe-based package of a MEMS can be applied to piezoresistive pressure sensors, where the conversion of pressure to an electronically detectable signal relies on the elastic deformation of a membrane, or generally of a structure, that is exposed to the pressure.

As another example, the integration of the movable element into the leadframe-based package of a MEMS can be applied to resonant pressure sensors, where the resonance frequency depends on the mechanical stress in the vibrating microstructure.

As another example, the method of integrating the movable element into the MEMS package allows an inexpensive fine-tuning of the mechanical transfer function by controlling the thickness of the membrane and by adding one or more mass units of squashed balls produced in wire bonding technique.

It is therefore intended that the appended claims encompass any such modifications or embodiments.

We claim:

1. A method for fabricating a microelectromechanical system (MEMS) device, comprising:
   providing a leadframe having a first surface, the leadframe defining a plurality of leads and a segment;
   depositing a polymeric compound over the leadframe first surface including at the leads and a peripheral portion of the segment, leaving the first surface at another portion of the segment unencapsulated at a bottom of an opening through the polymeric compound, the unencapsulated portion defining a movable part of the MEMS device; and connecting a semiconductor chip having electronic circuitry on a first chip surface at the leads to a second surface of the leadframe, so that the first chip surface spans across the movable part, separated from the movable part by a gap.

2. The method of claim 1, wherein the leadframe is provided in the form of a patterned metal sheet.

3. The method of claim 2, further comprising thinning a thickness of the segment at the unencapsulated portion after depositing the polymeric compound.

4. The method of claim 3, wherein the leads comprise first and second leads; the semiconductor chip is connected at the first leads; and solder balls are attached to the second leads for connection to external parts.

5. The method of claim 1, further comprising thinning a thickness of the segment at the unencapsulated portion after depositing the polymeric compound.

6. The method of claim 1, wherein providing the leadframe includes depositing a metal layer onto a carrier and patterning the metal layer to define the leads and the segment; and the method further comprises removing the carrier from the patterned metal layer after depositing the polymeric compound and before connecting the semiconductor chip.

7. A method for fabricating a microelectromechanical system (MEMS) device, comprising:

providing a leadframe having first and second surfaces, the leadframe defining a plurality of leads and a segment;

encapsulating the second leadframe surface in a polymeric compound of a thickness, leaving a portion of the second leadframe surface at the segment unencapsulated at an opening through the thickness;

thinning the segment at the location of the unencapsulated portion to define a foil suitable as a movable part of the MEMS device; and connecting a semiconductor chip having electronic circuitry on a first chip surface to the leads at the first leadframe surface so that the first chip surface with the electronic circuitry faces and spans the foil, separated from the foil by a gap.

8. The method of claim 7, further comprising forming a solderable metallurgical configuration on the first leadframe surface.

9. The method of claim 7, wherein the leadframe is provided as a preformed planar metal part.

10. The method of claim 7, further comprising configuring the leadframe to provide the segment and first ones of the leads in a first plane, and second ones of the leads in a second plane offset from the first plane.

11. The method of claim 7, further comprising hardening the deposited polymeric compound by polymerization.

12. The method of claim 7, wherein the circuitry of the chip includes a metal plate; and connecting the chip includes aligning the metal plate with the leadframe segment.

* * * * *